(12) United States Patent
Mazzochette et al.

(10) Patent No.: US 7,176,502 B2
(45) Date of Patent: *Feb. 13, 2007

(54) LIGHT EMITTING DIODES PACKAGED FOR HIGH TEMPERATURE OPERATION

(75) Inventors: Joseph Mazzochette, Cherry Hill, NJ (US); Greg Blonder, Summit, NJ (US)

(73) Assignee: Lamina Ceramics, Inc., Westampton, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 11/083,862

(22) Filed: Mar. 18, 2005

(65) Prior Publication Data

US 2005/0161682 A1   Jul. 28, 2005

Related U.S. Application Data

(62) Division of application No. 10/638,579, filed on Aug. 11, 2003, now Pat. No. 7,095,053.

(60) Provisional application No. 60/467,857, filed on May 5, 2003.

(51) Int. Cl.
*H01L 33/00* (2006.01)
(52) U.S. Cl. .......................... 257/99; 257/100
(58) Field of Classification Search ................ 257/79, 257/80, 81, 98, 99, 82, 676, 100
See application file for complete search history.

(56) References Cited

U.S. PATENT DOCUMENTS

| | | |
|---|---|---|
| 3,711,789 A | 1/1973 | Dierschke |
| 4,886,709 A | 12/1989 | Sasame et al. .............. 428/552 |
| 4,935,655 A | 6/1990 | Ebner |
| 5,117,281 A | 5/1992 | Katsuraoka .................. 357/81 |
| 5,122,781 A | 6/1992 | Saubolle ..................... 340/473 |
| 5,140,220 A | 8/1992 | Hasegawa .................... 313/512 |
| 5,482,898 A | 1/1996 | Marrs ......................... 437/216 |
| 5,485,037 A | 1/1996 | Marrs ......................... 257/712 |
| 5,581,876 A | 12/1996 | Prabhu et al. ................ 29/851 |
| 5,660,481 A | 8/1997 | Ignatius et al. |
| 5,725,808 A | 3/1998 | Tormey et al. .............. 252/514 |
| 5,745,624 A | 4/1998 | Chan et al. ................... 385/91 |
| 5,841,244 A | 11/1998 | Hamilton et al. |
| 5,847,935 A | 12/1998 | Thaler et al. ............... 361/761 |

(Continued)

FOREIGN PATENT DOCUMENTS

JP   10-012926   * 1/1998

(Continued)

*Primary Examiner*—Phat X. Cao
(74) *Attorney, Agent, or Firm*—Lowenstein Sandler PC (57) ABSTRACT

In accordance with the invention, an LED packaged for high temperature operation comprises a metal base including an underlying thermal connection pad and a pair of electrical connection pads, an overlying ceramic layer, and a LED die mounted overlying the metal base. The LED is thermally coupled through the metal base to the thermal connection pad, and the electrodes are electrically connected to the underlying electrical connection pads. A low thermal resistance insulating layer can electrically insulate other areas of die from the base while permitting heat passage. Heat flow can be enhanced by thermal vias to the thermal connector pad. Ceramic layers formed overlying the base can add circuitry and assist in distributing emitted light. The novel package can operate at temperatures as high as 250° C.

11 Claims, 13 Drawing Sheets

U.S. PATENT DOCUMENTS

| | | |
|---|---|---|
| 5,857,767 A | 1/1999 | Hochstein .................. 362/294 |
| 5,953,203 A | 9/1999 | Tormey et al. ............. 361/313 |
| 5,977,567 A | 11/1999 | Verdiell ....................... 257/99 |
| 6,016,038 A | 1/2000 | Mueller et al. |
| 6,045,240 A | 4/2000 | Hochstein .................. 362/294 |
| 6,220,722 B1 | 4/2001 | Begemann .................. 362/231 |
| 6,259,846 B1 | 7/2001 | Roach et al. |
| 6,318,886 B1 | 11/2001 | Stopa et al. |
| 6,325,524 B1 | 12/2001 | Weber et al. ............... 362/245 |
| 6,376,268 B1 | 4/2002 | Verdiell ....................... 438/26 |
| 6,428,189 B1 | 8/2002 | Hochstein .................. 362/373 |
| 6,455,930 B1 | 9/2002 | Palanisamy et al. ........ 257/706 |
| 6,480,389 B1 | 11/2002 | Shie et al. .................. 361/707 |
| 6,483,623 B1 | 11/2002 | Maruyama .................. 359/180 |
| 6,518,502 B2 | 2/2003 | Hammond et al. ........ 174/52.4 |
| 6,634,750 B2 | 10/2003 | Neal et al. .................. 351/211 |
| 6,634,770 B2 | 10/2003 | Cao ........................... 362/294 |
| 6,670,751 B2 | 12/2003 | Song et al. .................. 313/512 |
| 6,692,252 B2 | 2/2004 | Scott ........................... 433/29 |
| 6,793,374 B2 | 9/2004 | Begemann |
| 6,799,864 B2 | 10/2004 | Bohler et al. ............... 362/236 |
| 6,828,170 B2 | 12/2004 | Roberts et al. ............... 438/27 |
| 2001/0032985 A1 | 10/2001 | Bhat et al. |
| 2002/0004251 A1 | 1/2002 | Roberts et al. |
| 2002/0034834 A1 | 3/2002 | Verdiell |
| 2002/0163006 A1 | 11/2002 | Yoganandan et al. ......... 257/81 |
| 2002/0175621 A1 | 11/2002 | Song et al. |
| 2002/0176250 A1 | 11/2002 | Bohler et al. |
| 2003/0010993 A1 | 1/2003 | Nakamura et al. |
| 2003/0025465 A1 | 2/2003 | Swanson et al. |
| 2003/0057421 A1 | 3/2003 | Chen .......................... 257/79 |
| 2004/0026706 A1 | 2/2004 | Bogner et al. ................ 257/99 |
| 2004/0150995 A1 | 8/2004 | Coushaine et al. |
| 2004/0222433 A1 | 11/2004 | Mazzochette et al. |
| 2004/0233672 A1 | 11/2004 | Dubuc |
| 2005/0029535 A1 | 2/2005 | Mazzochette et al. |
| 2005/0189557 A1 | 9/2005 | Mazzochette et al. |
| 2005/0225222 A1 | 10/2005 | Mazzochette et al. |
| 2006/0006405 A1* | 1/2006 | Mazzochette ................ 257/99 |

FOREIGN PATENT DOCUMENTS

| | | | |
|---|---|---|---|
| JP | 2000-294701 | 10/2000 | ................ 257/712 |

* cited by examiner

LIGHT EMITTING DIODES PACKAGED FOR HIGH TEMPERATURE OPERATION

CROSS REFERENCE TO RELATED APPLICATIONS

This application is a divisional of U.S. patent application Ser. No. 10/638,579, U.S. Pat. No. 7,095,053, filed by Joseph Mazzochette, et al. on Aug. 11, 2003 ("Light Emitting Diodes Packaged For High Temperature Operation") which, in turn, claims the benefit of U.S. Provisional Application Ser. No. 60/467,857 ("Light Emitting Diodes Packaged For High Temperature Operation") filed by J. Mazzochette, et al. on May 5, 2003. The aforementioned Ser. Nos. 10/638,579 and 60/467,857 applications are incorporated herein by reference.

FIELD OF THE INVENTION

This invention relates to light emitting diodes and, in particular, to light emitting diodes packaged for high temperature operation.

BACKGROUND OF THE INVENTION

Light emitting diodes (LEDs) are being used as light sources in an increasing variety of applications extending from communications and instrumentation to household, automotive and visual display. Many of these applications require higher levels of power or subject the LEDs to higher temperature operating environments. In response, LED manufacturers have improved the purity of the semiconductor materials in order to keep the LED output intensity high as temperature increases. As a result, desired applications of LEDs are now constrained by the thermal limits of their packaging.

The currently prevalent plastic LED packages have an operational temperature limit of about 80° C. Some LED die, however, will operate at 120° C., and industry preference is for an operational temperature of about 200° C. Accordingly there is a need for an improved light emitting diode packaged for high temperature operation.

SUMMARY OF THE INVENTION

In accordance with the invention, an LED packaged for high temperature operation comprises a metal base including an underlying thermal connection pad and a pair of electrical connection pads, an overlying ceramic layer, and a LED die mounted overlying the metal base. The LED is thermally coupled through the metal base to the thermal connection pad, and the electrodes are electrically connected to the underlying electrical connection pads. A low thermal resistance insulating layer can electrically insulate other areas of die from the base while permitting heat passage. Heat flow can be enhanced by thermal vias to the thermal connector pad. Ceramic layers formed overlying the base can add circuitry and assist in distributing emitted light. The packaged diode can be made by the low temperature co-fired ceramic on metal technique (LTCC-M). The LTCC-M packaged diode can operate at temperatures as high as 250° C.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for illustrating the concepts of the invention and are not to scale.

DETAILED DESCRIPTION

This description is divided into two parts. In Part I describes the structure and features of light emitting diodes (LEDs) packaged for high temperature operation in accordance with the invention and illustrate exemplary embodiments. In Part II we provide further details of the LTCC-M technology used in packaging the LEDs.

I. LEDS Packaged for High Temperature Operation

Figure 1A:
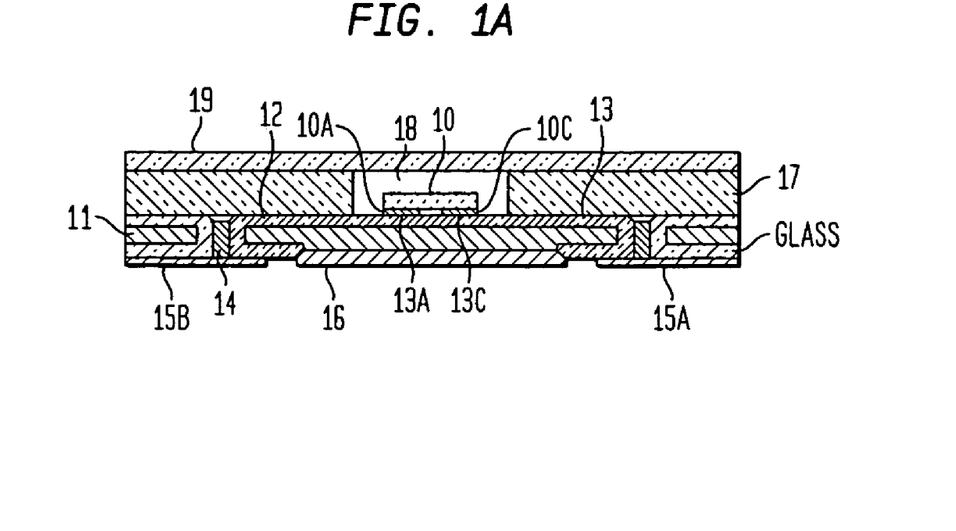
FIG. 1 is a schematic cross section of a first embodiment of an LED packaged for high temperature operation.
Figure 1B:
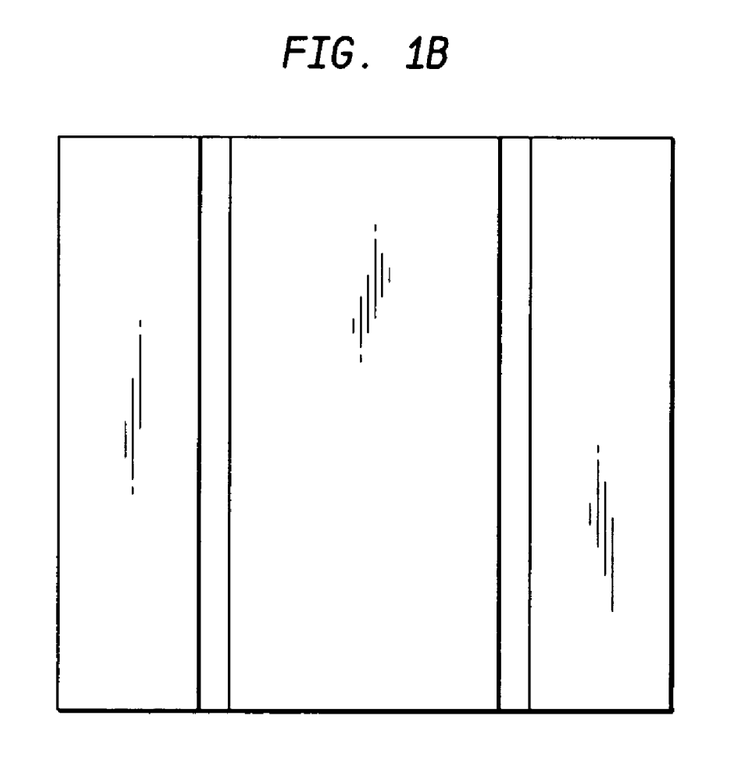

Referring to the drawings, FIG. 1 is a schematic cross section of an LED 10 packaged for high temperature operation. LED 10 is mounted overlying and thermally coupled to a metal base 11. Advantageously the metal base 11 includes a patterned low thermal resistance, electrically insulating layer 12 to provide electrical insulation from the base 11 and a patterned conductive layer 13 to provide thermal coupling and electrical connection. The layers 12 and 13 can be patterned to provide insulation or electrical connection regions as desired. An LED 10 having an anode 10A and a cathode 10C can be mounted overlying the base 11 by solder bonding the electrodes 10A and 10C to conductive pad regions 13A and 13C of patterned conductive layer 13.

Electrical connections may be made through the metal base 11 to underlying electrical connection pads 15A and 15B using electrically insulated vias 14 or the metal of the base 11. Solderable electrical connection pads 15A and 15B may be deposited on the underside of metal base 11 to permit surface mounting of the base 11 on a printed circuit board (not shown). The remaining areas of the base 11 may be provided with one or more thermal connector pads 16 to carry heat from the LED package to the printed circuit board. Advantageously the base 11 makes contact with plated through holes (not shown) in a printed circuit board during solder assembly. Such through holes would transfer heat from the diode package into the PCB carrier (typically aluminum or copper).

Overlying the base 11, one or more ceramic layers 17 can be added to the surface of the package. The ceramic layers on the base 11 form a cavity 18 around the LED 10. The shape of the cavity walls, as will be discussed below, can affect the distribution of light from the LED 10. The ceramic layer 17 can include circuitry for connecting multiple diodes in an array, electrostatic discharge protection circuitry, diode control and power supply connections and other surface mount components (not shown in FIG. 1).

A transparent cover 19 can be provided by bonding a transparent clear cover or lens over the cavity 18 (as by epoxy). The seal can be made hermetic by addition of a bonding pad and brazed seal ring (not shown).

In an advantageous embodiment, the metal base 11 is copper/molybdenum/copper (CMC), the low thermal resistance electrical insulating layer 12 (about 2 micrometers) can be an oxidized layer of the metal base, deposited glass or another deposited insulator such as nickel oxide (about 2 micrometers), and the conductive layer 13 can be gold, silver or other suitable conductor. The LED electrodes 10A, 10C can be solder bonded to the gold bonding pads 13A, 13C by AuSn solder. The underlying pads 15 and 16 for electrical connection and heat sinking are preferably PdAg and Ag, respectively.

Figure 2:
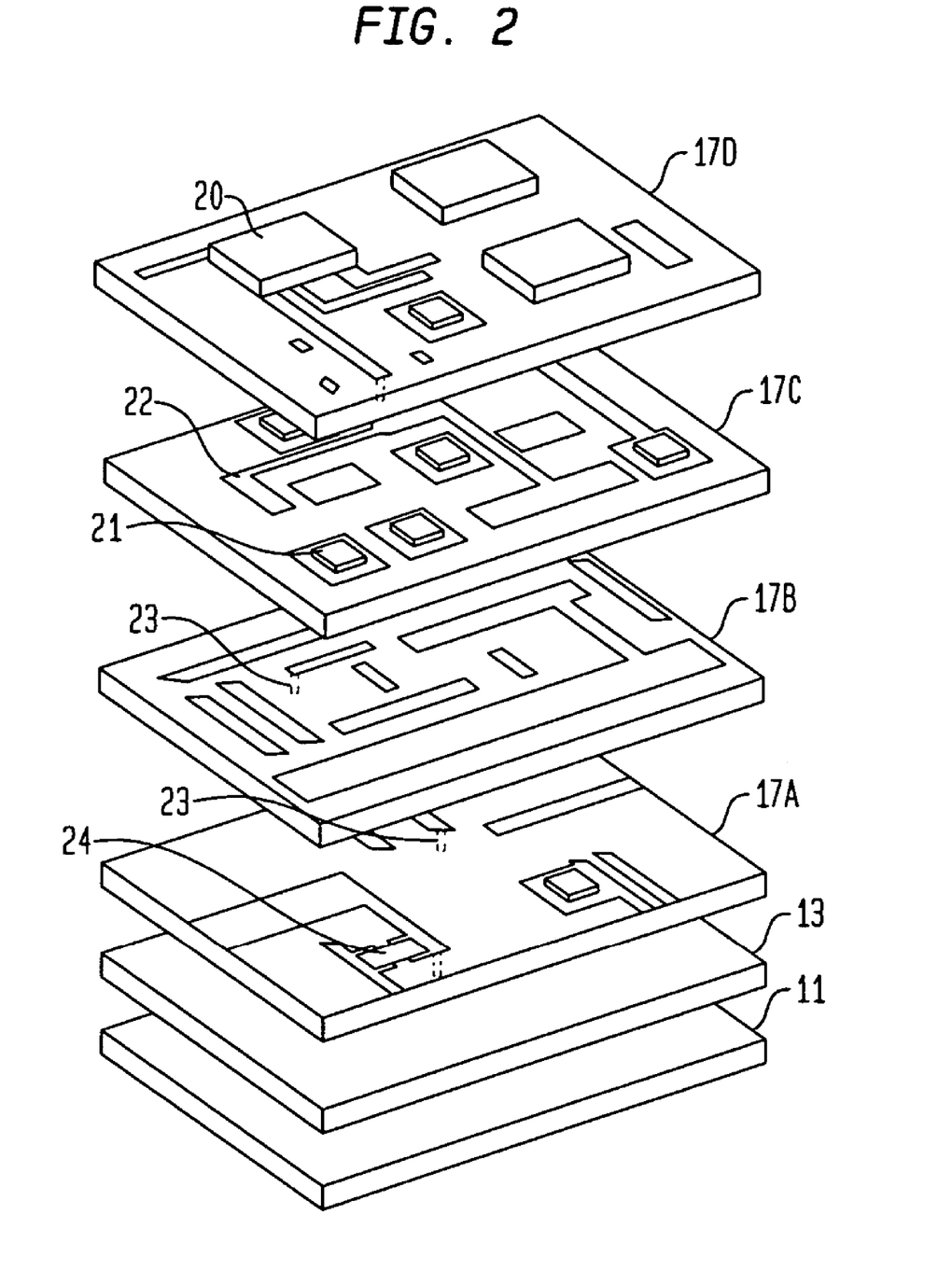
FIG. 2 illustrates how circuit components can be added to the overlying ceramic layer.

As shown in FIG. 2, the ceramic layer 17 overlying base 11 can be composed of a plurality of ceramic layers 17A, 17B, 17C and 17D. Each ceramic layer can include circuit components for powering, controlling, protecting and interconnecting LEDs. While the circuitry will vary for different applications, FIG. 2 illustrates how to add surface mounted active devices 20, buried capacitors 21, connectors 22, interconnecting vias 23, and buried resistors 24. The metal base 11 with overlying ceramic layer 17 incorporating circuitry can be fabricated using the low temperature co-fired ceramic on metal technique (LTCC-M) described, for example, in U.S. Pat. No. 6,455,930 issued Sep. 24, 2002 and incorporated herein by reference.

Since a good amount of light is emitted from the edges of LED die, the shape of the ceramic cavity is an important factor in the total light efficiency. The ceramic cavity walls can be formed in a variety of ways including embossing, coining, stamping, forming by lamination, or routing the ceramic in the "green" or unfired state.

Figure 3A:
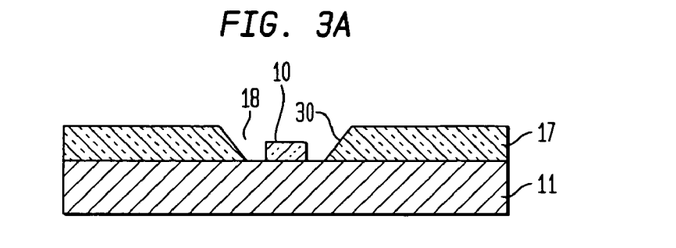
FIGS. 3A and 3B illustrate exemplary light dispersive cavities in the ceramic layer.
Figure 3B:
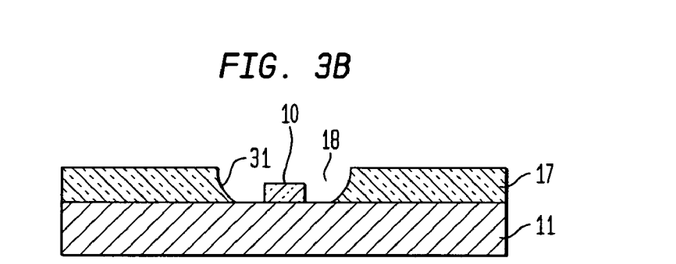

FIGS. 3A and 3B illustrate exemplary light dispersive cavities for the LED of FIG. 1. In FIG. 3A the cavity 18 is provided with walls 30 having straight taper. In FIG. 3B, the walls 31 have a parabolic taper. In general, each diode cavity 18 can be shaped to improve the light output and focus. White fired glass ceramic is reflective and disperses light to reduce the appearance of bright spots. The reflectivity of the cavity surface can be increased by polishing the surface or by applying a reflective coating such as silver, as by spraying, painting, sputtering or chemical vapor disposition. It is advantageous to smooth the side walls so that applied materials such as epoxy will shrink back and form a reflective gap.

Figure 4:
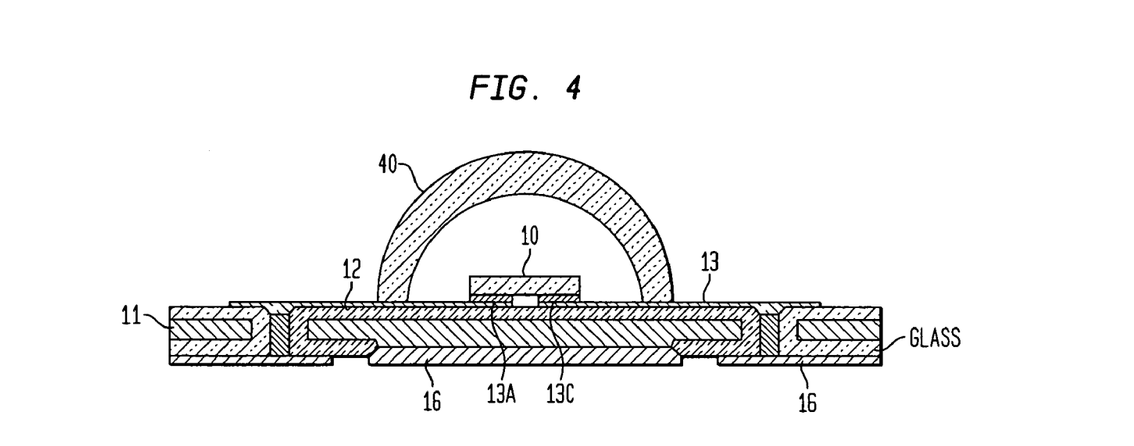
FIG. 4 is a schematic cross section of an alternative embodiment of an LED.

FIG. 4 is a schematic cross section of an alternative embodiment of a single LED packaged for high temperature operation. In this embodiment a lens 40 overlying the LED 10 replaces the ceramic layer 17, cavity 18 and lens cover 19. The other features of the FIG. 4 device are substantially the same as described for the FIG. 1 device.

Other variations of the high temperature LED would include a LED die with a single electrode on the bottom of the package with the second electrode as a wire bondable pad on the top side. Or both electrodes could be on the top surface with wire bonding to each.

Figure 5:
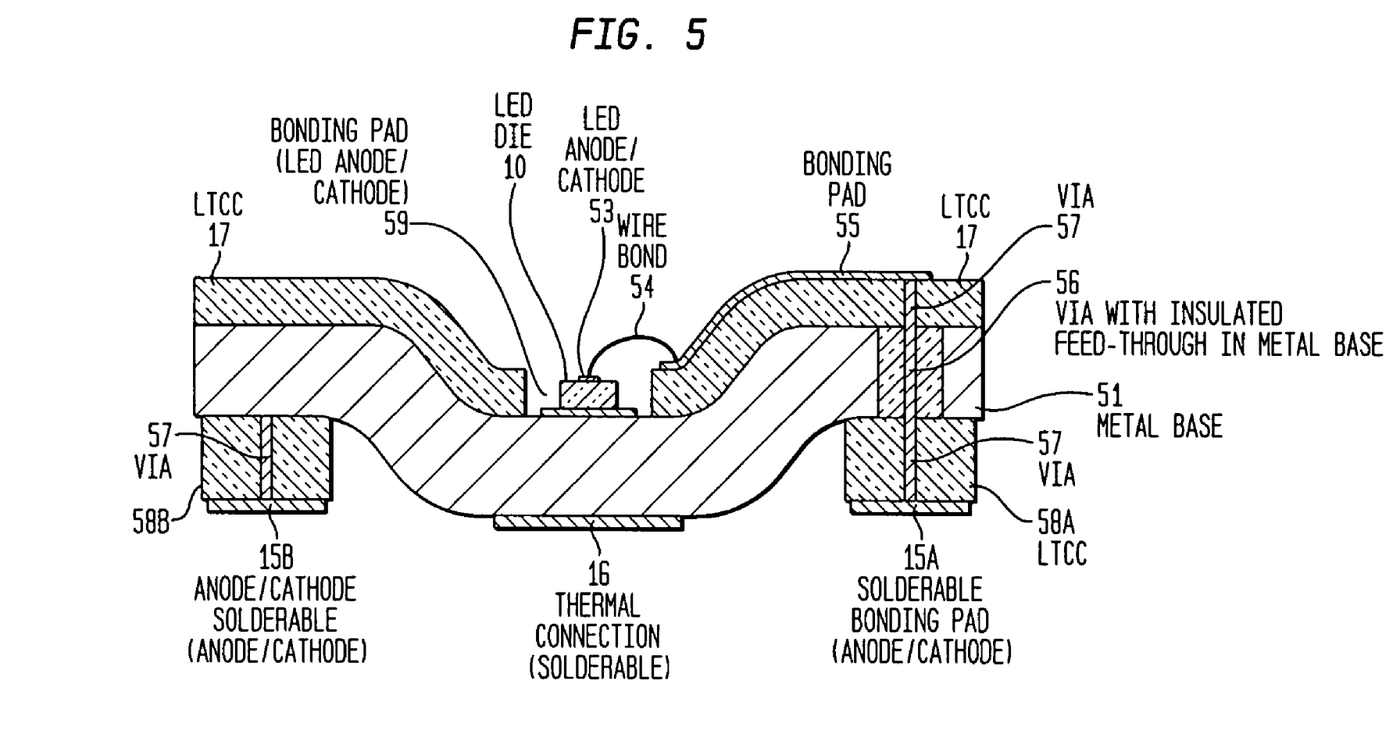
FIGS. 5, 6 and 7 show alternative embodiments of the packaged LED.

FIG. 5 is a schematic cross section of an alternative LED packaged for high temperature applications. The FIG. 5 device is similar to FIG. 1 device except that the metal base 51 is formed, as by coining, to include a concave light reflecting cavity 52 around the LED die 10. FIG. 5 also illustrates that the LED die 10 can have one of its electrodes 53 on its top surface. The top electrode 53 can be connected, for example by a bonding wire 54 to a top bonding pad 55 on the ceramic 17 and through via 57 including insulated via section 56 to the bonding pad 15A underlying the formed metal base 51. The other LED electrode can be on the bottom surface connected to bonding pad 59 and further connected by way of the metal base and via 57 to the second underlying bonding pad 15B. The formed metal base 51 can be provided with underlying ceramic supports 58A, 58B so that underlying bonding pads 15A, 15B are coplanar with thermal base connector 16. This arrangement presents pads 15A, 15B and connector 16 in a single plane for surface mount connection onto a PC board.

Figure 6:
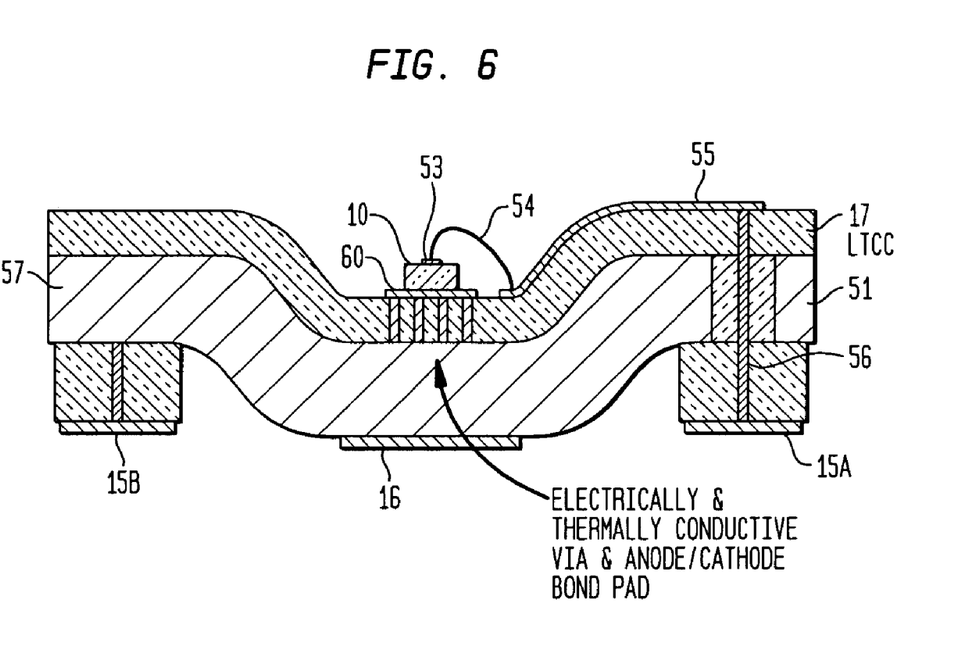

The embodiment of FIG. 6 is similar to that of FIG. 5 except that the LED 10 is mounted on the ceramic layer 17 rather than on the formed metal base 51. Here the ceramic layer 17, conforming to the coined metal base, acts as a light reflector. The bottom electrode of the LED 10 can be connected to metal base 51 by way of a bonding pad 60 and conductive vias 61 through the ceramic to the base 51. The vias 61 are numbered and dimensioned to conduct heat as well as electricity.

Figure 7:
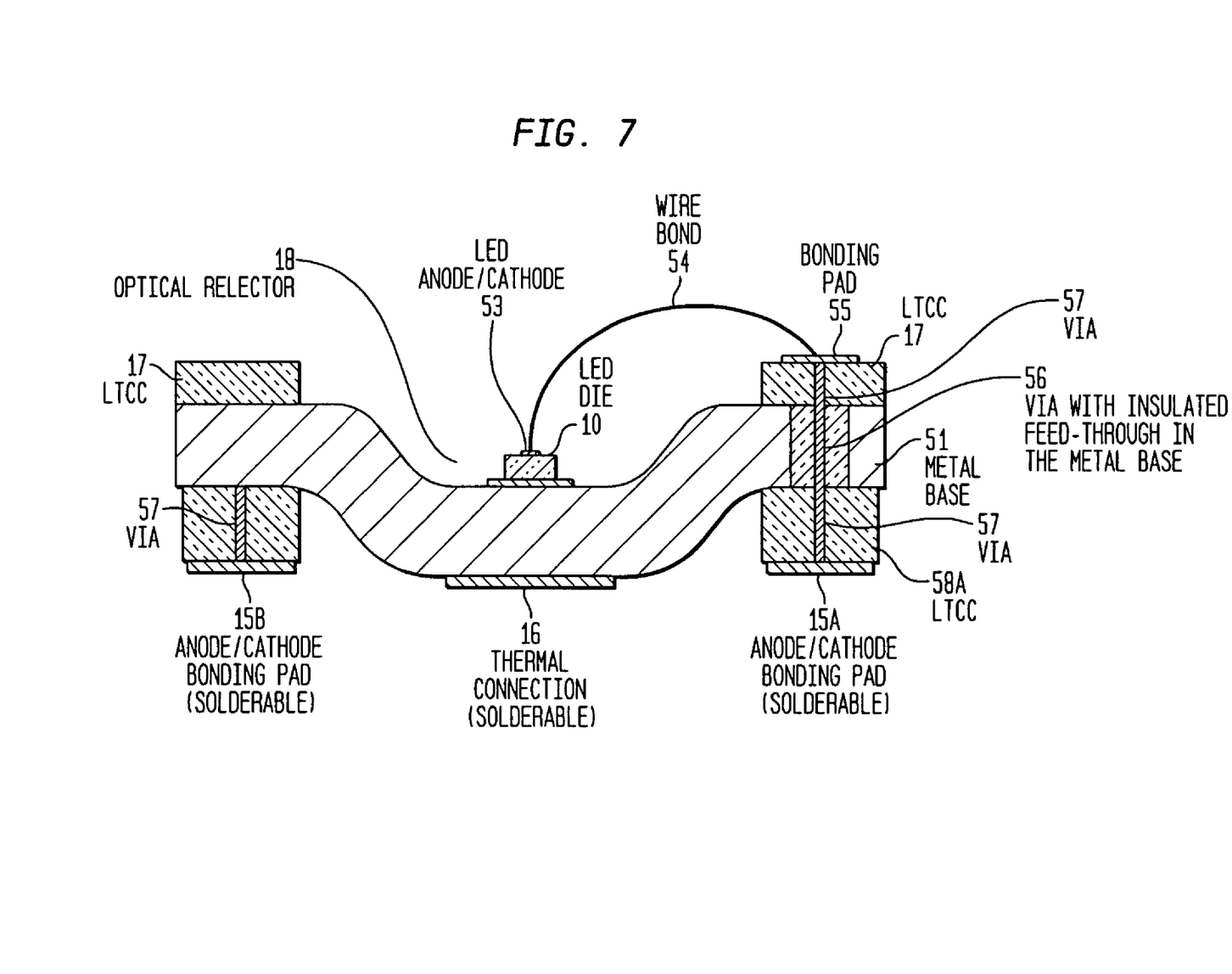

The FIG. 7 embodiment is similar to the FIG. 5 embodiment except that the cavity 18 in the ceramic layer 17 is enlarged so that the shaped region of formed metal base 51 is more widely exposed for acting as a layer area reflector.

The LED structure of FIG. 1 may easily be replicated to form an array of LEDs.

Figure 8:
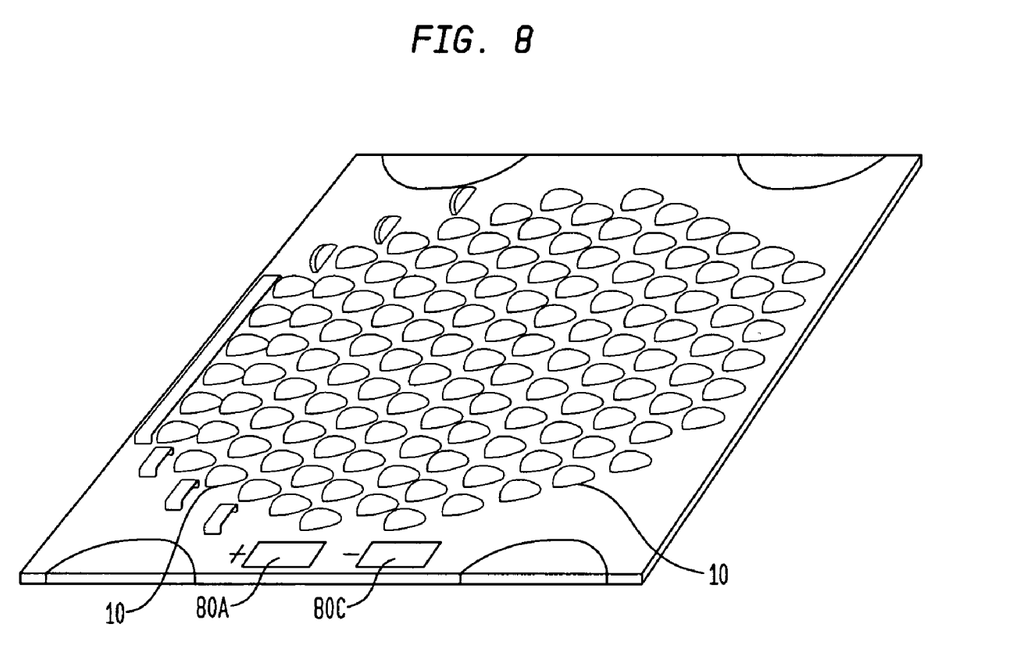
FIG. 8 depicts an array of LEDs in accordance with the embodiment of FIG. 1.

FIG. 8 illustrates an exemplary array 80 of diodes 10, with buried interconnection circuitry (not shown) added to the ceramic (17 of FIG. 1) connected to common electrodes 81A, 81C.

Figure 9:
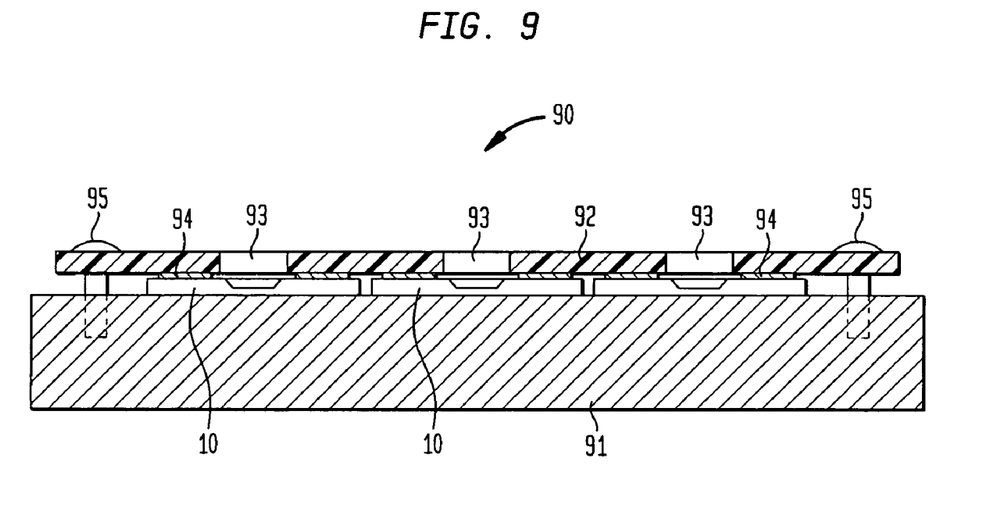
FIG. 9 illustrates, in schematic cross section an array that is particularly easy to fabricate.

FIG. 9 is a schematic cross section of an array 90 of LTCC-M packaged LED diodes 10 that is particularly easy to fabricate. In essence array 90 comprises a plurality of diodes 10 disposed between a heat sink 91 and an apertured PC board 92. The light emitting portion of each LED 10 is aligned with a corresponding window aperture 93 of PC board 92. The PC board 92 advantageously contains the control and driver circuits (not shown) and electrical connections between the circuits and the LED's, e.g. connections 94. The PC Board 92 can be conveniently secured to the heat sink (which can be a sheet of aluminum), as by screws 95, to hold the diodes 10 in thermal contact with the heat sink. Advantageously thermal coupling between the diodes and the heat sink can be facilitated by thermal grease.

The array 90 is particularly easy to fabricate. After forming PC board 92 and providing a plurality of LTCC-M packaged diodes 10 as described herein, the diodes can be surface mounted on the PC board with the light emitting portions aligned with apertures, and LED contacts aligned with PC board contacts. After solder reflow connection, the PC board 92 can be secured to the heat sink 91 by screws 95. The apertures and LEDs can be arranged across the surface of the board to achieve any desired configuration of a two-dimensional array of LEDs.

Figure 10:
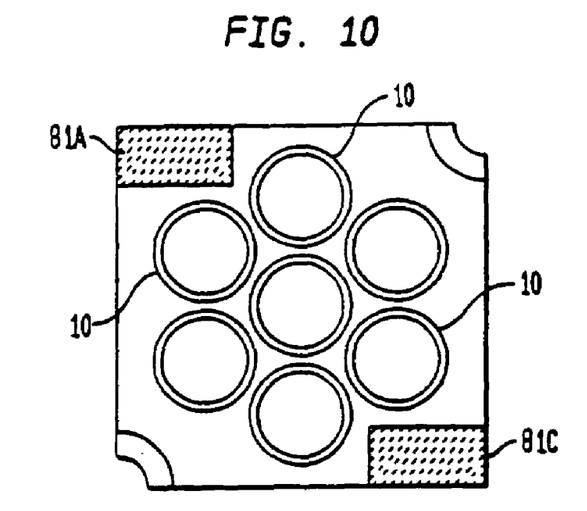
FIGS. 10 and 11 are top views of advantageous arrays.

FIG. 10 is a top view illustrating a first advantageous configuration of LEDs 10 forming a closely packed hexagonal array. The PC board 92 includes common electrodes 81A and 81C.

Figure 11:
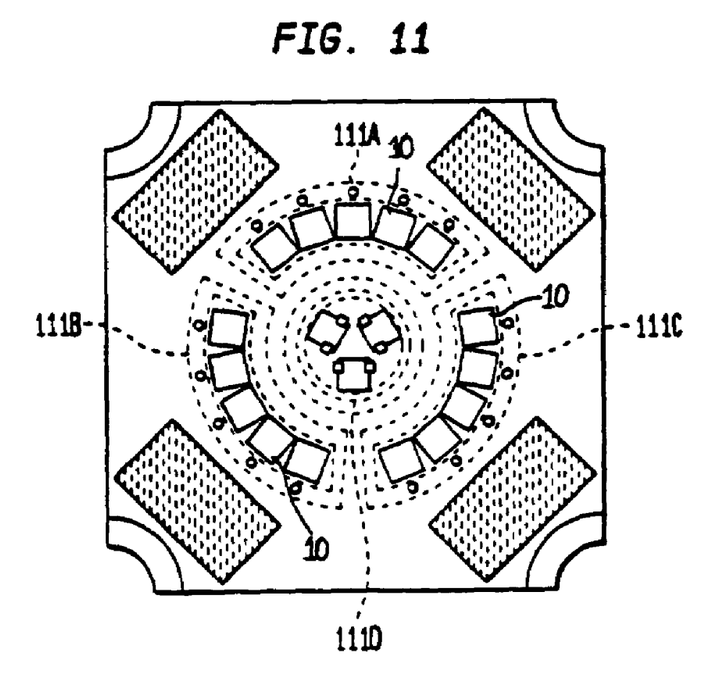

FIG. 11 is a top view of a second advantageous configuration. The LEDs are distributed in a plurality of sets 111A, 111B, and 111C in respective sectors around the circumference of a circle and in a set 111D in the center of the circle, all to emulate a concentrated light source.

Figure 12:
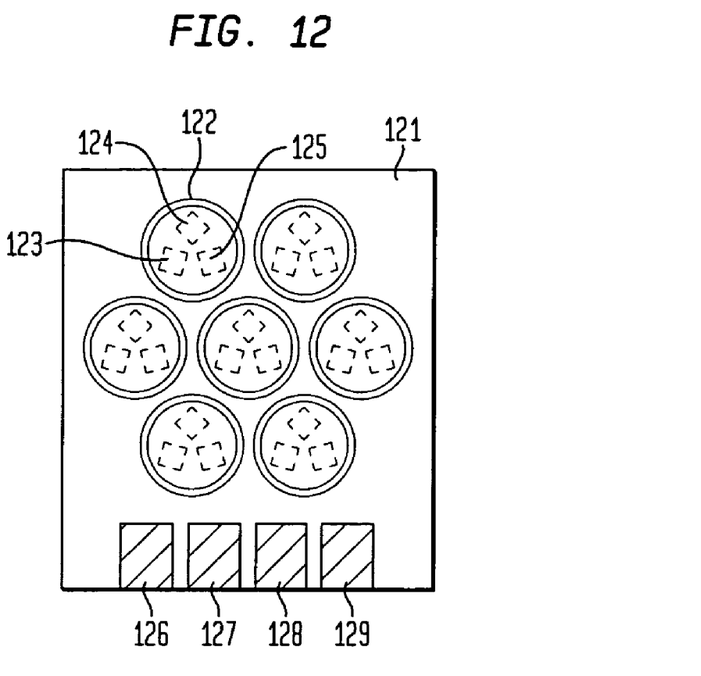
FIG. 12 shows the inventive LED array as a plug in card.

FIG. 12 shows an embodiment of the invention suitable for use as a plug in card. A plurality of cavities 122 includes a plurality LED die 123, 124, and 125. LED die 123, 124, and 125 can be identical die (for increased luminosity), or they can be individual colors and lit in various patterns for single, or mixed color displays. They can also be lit in various combinations to give variable intensity or to show patterns. Card contact fingers 126, 127, 128, and 129 show an exemplary embodiment to control the displayed color. Here, finger 129 is an electrical common (common cathode or common anode), and fingers 126, 127, and 128 are each connected to a single color die in each well to cause the card to light red, green, or blue respectively. In the example, each LED die is wired to the respective LED die of the same color in each well and to the respective control finger for that color. In another version of this embodiment, decoding/driver electronics can be embedded directly in the layers of the card and can control individual LED die or groups of die.

Figure 13:
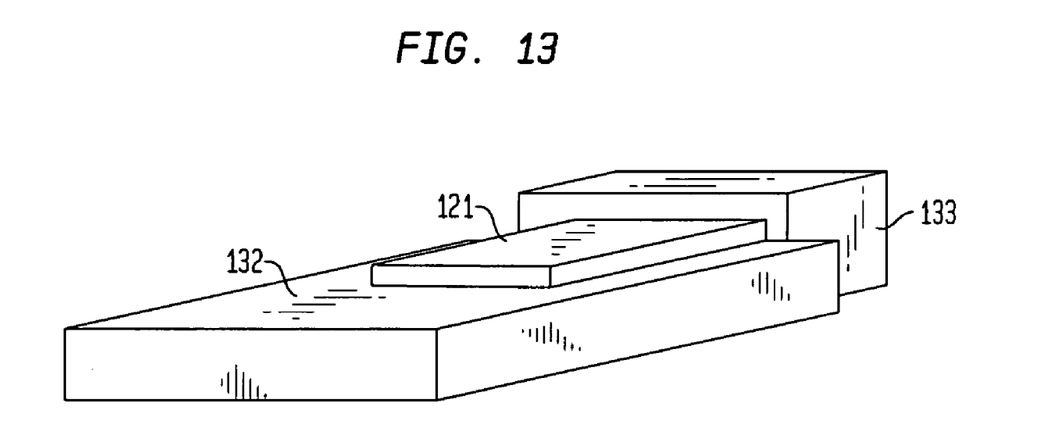
FIG. 13 shows the card of FIG. 12 mounted on an additional external heatsink.

FIG. 13 shows card advantageously mounted on heat sink 132 for additional cooling. Also the card is shown plugged into edge connector 133 showing how contact is made with contact fingers 126, 127, 128.

Figure 14:
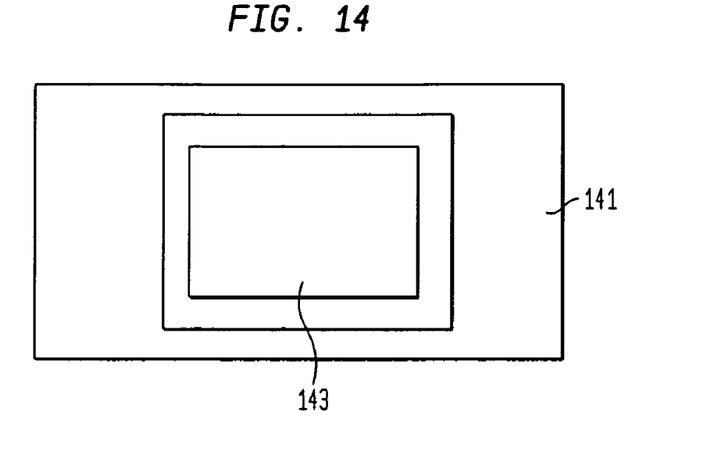
FIGS. 14 and 15 are a top and side view of flip-chip die bonded to the traces of an LTCC-M package by solder or gold balls.
Figure 15:
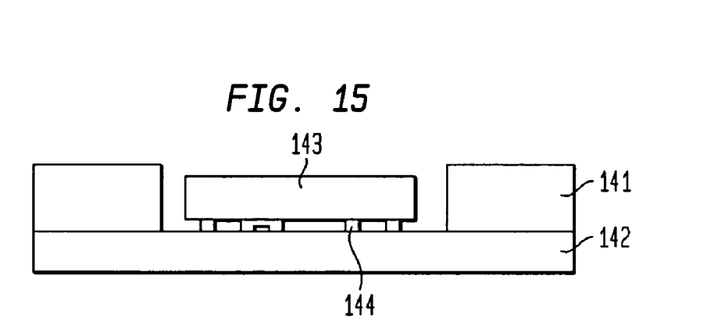
Figure 16:
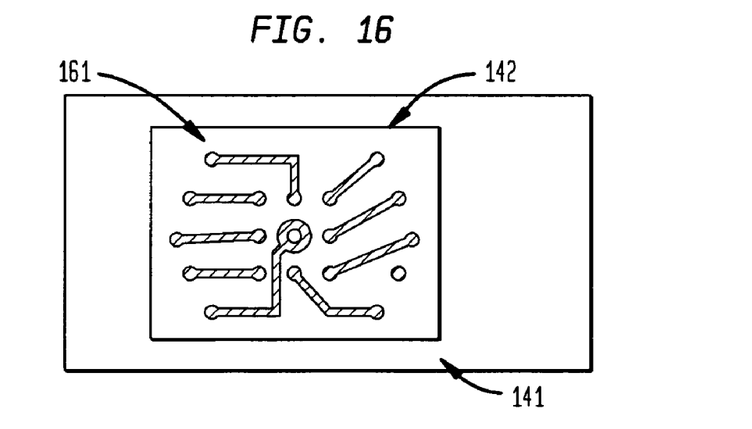
FIG. 16 shows conductive traces in an LTCC-M package.

Semiconductor die can also be directly connected as flip-chips to any of the described LED assemblies. In this embodiment, surfaces of the package can be bumped with a bondable material such as gold or solder. The bumps can be applied to correspond to the metal terminals of the semiconductor die. The die can then be attached to the package by applying heat and/or thermosonic agitation to create metallurgical connections between the bumped terminals on the package and the die terminals. This embodiment is shown in FIGS. 14 and 15. FIG. 14 is a top view showing flip-chip die 143 in LTCC-M package 141. FIG. 15 is a side view of the same assembly showing flip chip 143 connected to a wiring plane on surface 142 by bumps 144. FIG. 16 shows a top view of a package before the die is installed. Wiring traces 161 can be seen residing on surface 142.

Figure 17:
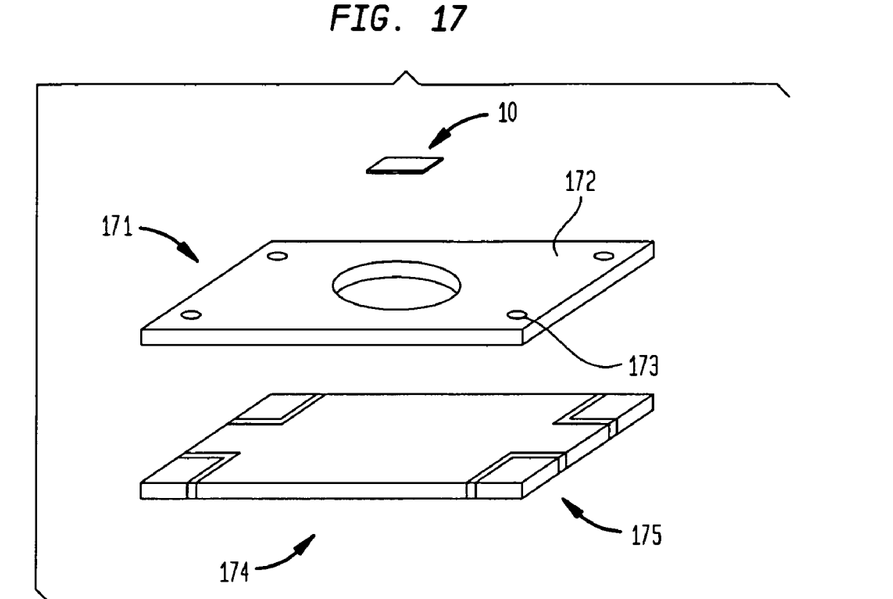
FIG. 17 shows a single LED package having isolated base terminals and vias.
Figure 18:
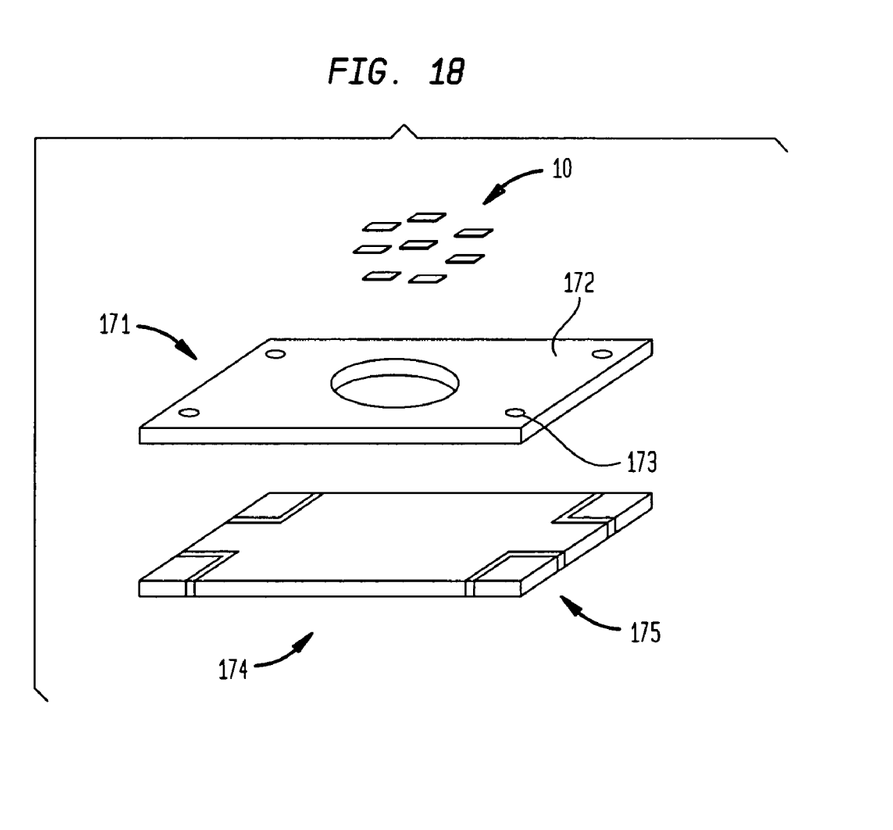
FIG. 18 shows the package of FIG. 17 adapted for a plurality of LED die.

In another embodiment of the invention, as shown in FIG. 17, connections to the LED assembly can be made by isolated terminals 175 on base 174. Openings in insulating layer 171 form wells for the LEDs as before. Insulating layer 171 can optionally include ground plane 172. Metal vias 173 can facilitate electrical connections from isolated terminals 175 to the die via conductive traces (not shown). FIG. 18 shows a version of this embodiment designed to house a plurality of die 10.

The invention may now be more clearly understood by consideration of the following specific example.

EXAMPLE

This part was built using a 13% copper, 74% molybdenum, 13% copper (CMC) metal laminate produced by H.C. Starck Corp. Thick film gold bonding pads are fired on the metal base to correspond to the location of each diode electrode. The pads are connected electrically and thermally to the CMC base. 4 layers of CMC-compatible ceramic tape are used to form the LED cavities, make the electrical connections, and form the array housing. The ceramic tape is composed of glasses and resins supplied by Ferro Corp. and others. The tape materials are ground, mixed, and cast into flat sheets. The sheets are then processed using common "green" tape processing including punching, printing, collating, and laminating.

Figure 19:
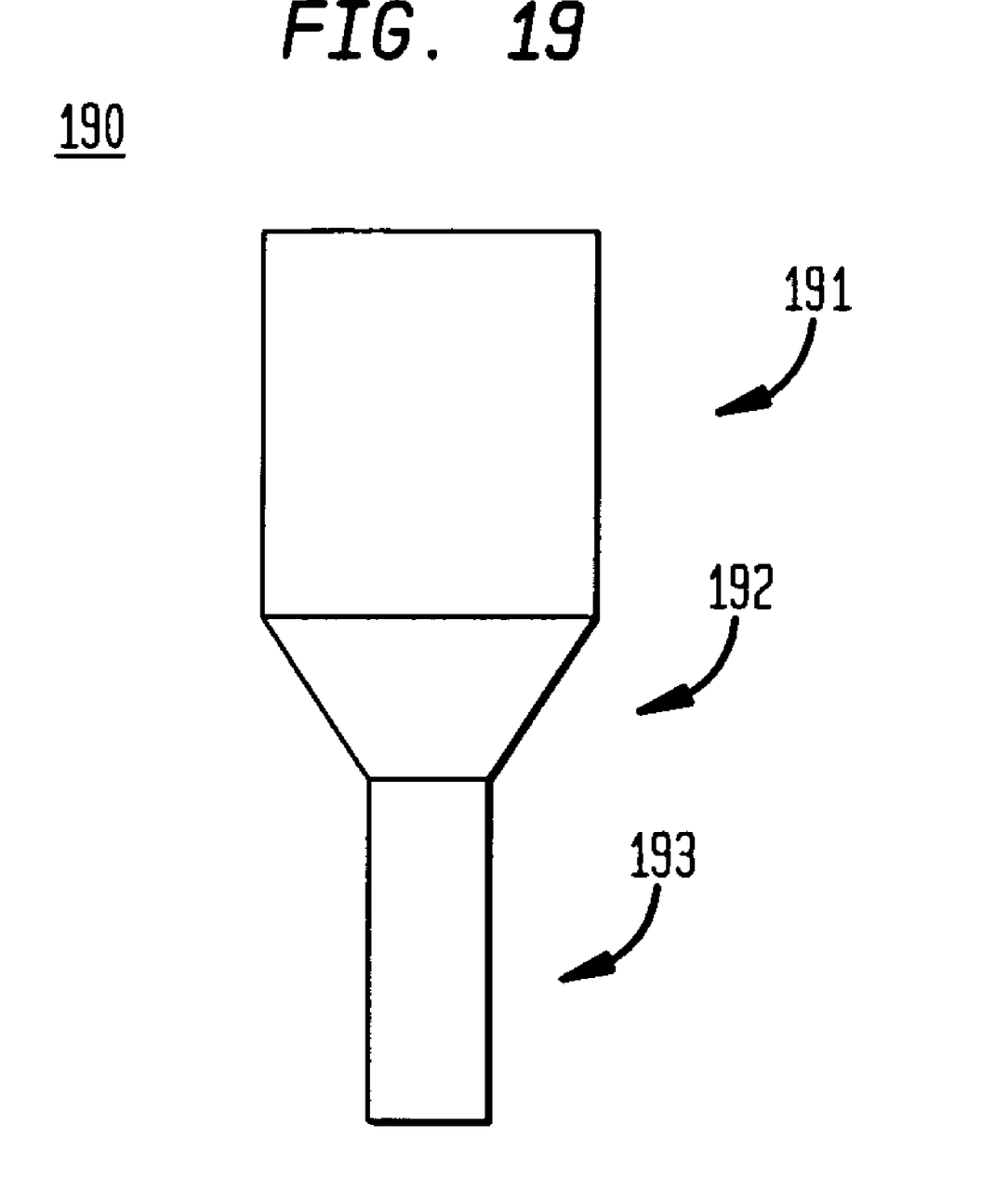
FIG. 19 shows a round punch tool for forming a tapered cavity.

The cavities are formed by routing (cutting away material with a rotary tool), pressing the shape using a rigid tool during lamination in the green state, or by punching the cavity in each ceramic layer (green-state punching) using a round punch tool 190 with punch shaft 191 and tapered shaft 192 (FIG. 19). Round Punch 193 pushes out the ceramic tape chad, then the tapered shaft 192 presses a taper into the green tape. The surface is optionally coated with a silver or aluminum metal powder prior to each punch. During the punching operation the metal powder is transferred to the ceramic tape. When fired, the metal sinters into the ceramic. The surface of the taper can also be polished after firing using a rotary polishing tool. A polished surface can also result by using a ceramic powder with a finer grain size in the production of the ceramic tape. The finer grain size reduces the surface roughness of the finished part.

The CMC base is attached during lamination and joined to the tape layers during firing at ~900° C. Multiple arrays are processed on a single wafer, which is then singulated by dicing after firing. After the package is complete, individual diodes are connected to the gold pads in the bottom of each cavity by soldering using 80% Au/20% Sn solder, or using electrically conductive epoxy such as Ablebond 84LMI. The gold pads are connected to the metal base. Conductive vias connect an electrical terminal on the top ceramic layer to the metal base. The anode or cathode are commonly connected to the back side of the diode which is in-turn connected to the gold bonding pad The opposite side of the diode is electrically connected to the array using a wire bond. The bond is connected from the diode to a bonding pad on one of the ceramic layers. Thick film, conductive traces are deposited onto the surface of the ceramic layer containing the bonding pads. The traces are connected to an electrical terminal on the top ceramic layer through electrically conductive vias. A variety of diode connections are possible including series, parallel, and combined series-parallel. Voltage dropping and current limiting resistors, inductors, and capacitors may be added as components buried in between the ceramic layers, or as discrete components mounted on the top surface of the package. Additional control, ESD protection, and voltage regulation semiconductors may be added in die or packaged form. Finally, an index matching epoxy, such as Hysol 1600, may be added to each diode cavity to improve the light output of each device, followed by a cover or lens that may be attached using clear Hysol 1600.

II. LTCC-M Packaging

Multilayer ceramic circuit boards are made from layers of green ceramic tapes. A green tape is made from particular glass compositions and optional ceramic powders, which are mixed with organic binders and a solvent, cast and cut to form the tape. Wiring patterns can be screen printed onto the tape layers to carry out various functions. Vias are then punched in the tape and are filled with a conductor ink to connect the wiring on one green tape to wiring on another green tape. The tapes are then aligned, laminated, and fired to remove the organic materials, to sinter the metal patterns and to crystallize the glasses. This is generally carried out at temperatures below about 1000° C., and preferably from about 750–950° C. The composition of the glasses determines the coefficient of thermal expansion, the dielectric constant and the compatibility of the multilayer ceramic circuit boards to various electronic components. Exemplary crystallizing glasses with inorganic fillers that sinter in the temperature range 700 to 1000° C. are Magnesium Alumino-Silicate, Calcium Boro-Silicate, Lead Boro-Silicate, and Calcium Alumino-Boricate.

More recently, metal support substrates (metal boards) have been used to support the green tapes. The metal boards lend strength to the glass layers. Moreover since the green tape layers can be mounted on both sides of a metal board and can be adhered to a metal board with suitable bonding glasses, the metal boards permit increased complexity and density of circuits and devices. In addition, passive and active components, such as resistors, inductors, and capacitors can be incorporated into the circuit boards for additional functionality. Where optical components, such as LEDs are installed, the walls of the ceramic layers can be shaped and/or coated to enhance the reflective optical properties of the package. Thus this system, known as low temperature cofired ceramic-metal support boards, or LTCC-M, has proven to be a means for high integration of various devices and circuitry in a single package. The system can be tailored to be compatible with devices including silicon-based devices, indium phosphide-based devices and gallium arsenide-based devices, for example, by proper choice of the metal for the support board and of the glasses in the green tapes.

The ceramic layers of the LTCC-M structure must be matched to the thermal coefficient of expansion of the metal support board. Glass ceramic compositions are known that match the thermal expansion properties of various metal or metal matrix composites. The LTCC-M structure and materials are described in U.S. Pat. No. 6,455,930, "Integrated heat sinking packages using low temperature co-fired ceramic metal circuit board technology", issued Sep. 24, 2002 to Ponnuswamy, et al and assigned to Lamina Ceramics. U.S. Pat. No. 6,455,930 is incorporated by reference herein. The LTCC-M structure is further described in U.S. Pat. Nos. 5,581,876, 5,725,808, 5,953,203, and 6,518502, all of which are assigned to Lamina Ceramics and also incorporated by reference herein.

The metal support boards used for LTCC-M technology do have a high thermal conductivity, but some metal boards have a high thermal coefficient of expansion, and thus a bare die cannot always be directly mounted to such metal support boards. However, some metal support boards are known that can be used for such purposes, such as metal composites of copper and molybdenum (including from 10–25% by weight of copper) or copper and tungsten (including 10–25% by weight of copper), made using powder metallurgical techniques. Copper clad Kovar®, a metal alloy of iron, nickel, cobalt and manganese, a trademark of Carpenter Technology, is a very useful support board. AlSiC is another material that can be used for direct attachment, as can aluminum or copper graphite composites.

Another instance wherein good cooling is required is for thermal management of flip chip packaging. FIGS. 14 and 15, for example show the inventive LED system where the LTCC-M package house LED die. Densely packed microcircuitry, and devices such as decoder/drivers, amplifiers, oscillators and the like which generate large amounts of heat, can also use LTCC-M techniques advantageously. Metallization on the top layers of an integrated circuit bring input/output lines to the edge of the chip so as to be able to wire bond to the package or module that contains the chip. Thus the length of the wirebond wire becomes an issue; too long a wire leads to parasitics. The cost of very high integration chips may be determined by the arrangement of the bond pads, rather than by the area of silicon needed to create the circuitry. Flip chip packaging overcomes at least some of these problems by using solder bumps rather than wirebond pads to make connections. These solder bumps are smaller than wire bond pads and, when the chip is turned upside down, or flipped, solder reflow can be used to attach the chip to the package. Since the solder bumps are small, the chip can contain input/output connections within its interior if multilayer packaging is used. Thus the number of transistors in it, rather than the number and size of bond pads will determine the chip size.

However, increased density and integration of functions on a single chip leads to higher temperatures on the chip, which may prevent full utilization of optimal circuit density. The only heat sinks are the small solder bumps that connect the chip to the package. If this is insufficient, small active or passive heat sinks must be added on top of the flip chip. Such additional heat sinks increase assembly costs, increase the number of parts required, and increase the package costs. Particularly if the heat sinks have a small thermal mass, they have limited effectiveness as well.

In the simplest form of the present invention, LTCC-M technology is used to provide an integrated package for a semiconductor component and accompanying circuitry, wherein the conductive metal support board provides a heat sink for the component. A bare semiconductor die, for example, can be mounted directly onto a metal base of the LTCC-M system having high thermal conductivity to cool the semiconductor component. In such case, the electrical signals to operate the component must be connected to the component from the ceramic. In FIGS. 5, 6, and 7, wire bond 54 serves this purpose. Indirect attachment to the metal support board can also be used. In this package, all of the required components are mounted on a metal support board, incorporating embedded passive components such as conductors and resistors into the multilayer ceramic portion, to connect the various components, i.e., semiconductor components, circuits, heat sink and the like, in an integrated package. The package can be hermetically sealed with a lid.

For a more complex structure having improved heat sinking, the integrated package of the invention combines a first and a second LTCC-M substrate. The first substrate can have mounted thereon a semiconductor device, and a multilayer ceramic circuit board with embedded circuitry for operating the component; the second substrate has a heat sink or conductive heat spreader mounted thereon. Thermoelectric (TEC) plates (Peltier devices) and temperature control circuitry are mounted between the first and second substrates to provide improved temperature control of semiconductor devices. A hermetic enclosure can be adhered to the metal support board.

The use of LTCC-M technology can also utilize the advantages of flip chip packaging together with integrated heat sinking. The packages of the invention can be made smaller, cheaper and more efficient than existing present-day packaging. The metal substrate serves as a heat spreader or heat sink. The flip chip can be mounted directly on the metal substrate, which is an integral part of the package, eliminating the need for additional heat sinking. A flexible circuit can be mounted over the bumps on the flip chip. The use of multilayer ceramic layers can also accomplish a fan-out and routing of traces to the periphery of the package, further improving heat sinking. High power integrated circuits and devices that have high thermal management needs can be used with this new LTCC-M technology.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. A LED device for high temperature operation comprising:
   at least one packaged LED assembly comprising a metal base having a thermal connection surface, wherein the at least one packaged LED assembly further comprises:
   at least one LED die having a pair of electrodes overlying and electrically insulated from the metal base, the LED die thermally coupled through the metal base to the thermal connection surface,
   a layer of ceramic overlying the metal base, the layer of ceramic having at least one opening to house the at least one LED die, and
   a plurality of conductive traces insulated from the metal base, the electrodes electrically connected to the conductive traces;
   an apertured printed circuit (PC) board overlying the at least one packaged LED assembly, the at least one LED die aligned with an aperture of the PC board; and
   a heat sink underlying the at least one packaged LED assembly, the heat sink secured in thermal contact with the thermal connection surface of the metal base of the at least one packaged LED assembly.

2. The device of claim 1 wherein the apertured PC board further comprises electrical connections to the at least one packaged LED assembly.

3. The device of claim 1 wherein the apertured PC board is secured to the heat sink to hold the at least one packaged LED assembly in thermal contact with the heat sink.

4. The device of claim 1 wherein thermal grease is disposed between the at least one packaged LED assembly and the heat sink to facilitate thermal coupling between the at least one packaged LED assembly and the heat sink.

5. The device of claim 1 wherein the at least one packaged LED assembly is surface mounted on the PC board with the at least one LED die aligned with apertures in the board.

6. The device of claim 1 wherein the at least one packaged LED assembly is connected to contacts on the PC board by solder reflow.

7. The device of claim 1 wherein the heat sink comprises aluminum.

8. The device of claim 1 wherein a plurality of packaged LED assemblies are disposed in a closely packed hexagonal array.

9. The device of claim 1 wherein a plurality of packaged LED assemblies are distributed in sectors around the circumference of a circle and in the center of the circle to emulate a concentrated light source.

10. The device of claim 1 wherein the at least one LED die comprises a plurality of LED dies disposed on the metal base in a closely packed hexagonal array.

11. The device of claim 1 wherein the at least one LED die comprises a plurality of LED dies distributed in sectors around the circumference of a circle and in the center of the circle to emulate a concentrated light source.

* * * * *